(12) United States Patent
Strang et al.

(10) Patent No.: US 7,732,227 B2
(45) Date of Patent: Jun. 8, 2010

(54) METHOD AND APPARATUS FOR WALL FILM MONITORING

(75) Inventors: Eric J. Strang, Chandler, AZ (US); Richard Parsons, Phoenix, AZ (US)

(73) Assignee: Tokyo Electron Limited, Tokyo (JP)

( * ) Notice: Subject to any disclaimer, the term of this patent is extended or adjusted under 35 U.S.C. 154(b) by 568 days.

(21) Appl. No.: 11/517,389

(22) Filed: Sep. 8, 2006

(65) Prior Publication Data
US 2007/0020776 A1 Jan. 25, 2007

Related U.S. Application Data

(62) Division of application No. 10/493,138, filed as application No. PCT/US02/31602 on Oct. 24, 2002, now Pat. No. 7,214,289.

(60) Provisional application No. 60/330,518, filed on Oct. 24, 2001, provisional application No. 60/330,555, filed on Oct. 24, 2001.

(51) Int. Cl.
H01L 21/66 (2006.01)
G01R 31/26 (2006.01)
C23C 14/54 (2006.01)
C23F 1/00 (2006.01)

(52) U.S. Cl. ............... 438/16; 427/10; 156/345.24; 156/345.28; 118/712; 700/121

(58) Field of Classification Search ............ 438/16, 438/696; 257/E21.521, E21.528; 118/712; 427/10; 156/345.24, 345.28
See application file for complete search history.

(56) References Cited

U.S. PATENT DOCUMENTS 5,151,296 A * 9/1992 Tokunaga .......... 438/488
5,200,021 A * 4/1993 Kawai et al. .......... 117/86
5,536,359 A * 7/1996 Kawada et al. .......... 438/16
5,897,378 A * 4/1999 Eriguchi .......... 438/707

(Continued)

FOREIGN PATENT DOCUMENTS

JP  2003-224115  8/2003

(Continued)

Primary Examiner—Walter L Lindsay, Jr.
Assistant Examiner—Ron Pompey
(74) Attorney, Agent, or Firm—Oblon, Spivak, McClelland, Maier & Neustadt, L.L.P.

(57) ABSTRACT

A wall film monitoring system includes first and second microwave mirrors in a plasma processing chamber each having a concave surface. The concave surface of the second mirror is oriented opposite the concave surface of the first mirror. A power source is coupled to the first mirror and configured to produce a microwave signal. A detector is coupled to at least one of the first mirror and the second mirror and configured to measure a vacuum resonance voltage of the microwave signal. A control system is connected to the detector that compares a first measured voltage and a second measured voltage and determines whether the second voltage exceeds a threshold value. A method of monitoring wall film in a plasma chamber includes loading a wafer in the chamber, setting a frequency of a microwave signal output to a resonance frequency, and measuring a first vacuum resonance voltage of the microwave signal. The method includes processing the wafer, measuring a second vacuum resonance voltage of the microwave signal, and determining whether the second measured voltage exceeds a threshold value using the first measured voltage as a reference value.

12 Claims, 6 Drawing Sheets

U.S. PATENT DOCUMENTS

| | | |
|---|---|---|
| 6,025,916 A | 2/2000 | Quick et al. |
| 6,390,019 B1 | 5/2002 | Grimbergen et al. |
| 6,432,479 B2 * | 8/2002 | Chang et al. .......... 427/255.394 |
| 6,534,007 B1 * | 3/2003 | Blonigan et al. .............. 422/62 |
| 6,592,817 B1 * | 7/2003 | Tsai et al. ..................... 422/62 |

FOREIGN PATENT DOCUMENTS

| | | |
|---|---|---|
| WO | WO 01/06402 A1 | 1/2001 |
| WO | WO 01/06544 A2 | 1/2001 |
| WO | WO 0106268 A1 | 1/2001 |

* cited by examiner

METHOD AND APPARATUS FOR WALL FILM MONITORING

CROSS-REFERENCE TO RELATED APPLICATIONS

The present application is a division of and claims the benefit of priority under 35 U.S.C. §120 from U.S. Ser. No. 10/493,138, filed Jul. 9, 2004. U.S. Ser. No. 10/493,138 claims the benefit of priority to PCT Application No. PCT/US02/31602, filed Oct. 24, 2002, which claims the benefit of priority to U.S. Provisional Ser. No. 60/330,518, filed on Oct. 24, 2001, and U.S. Provisional Ser. No. 60/330,555, filed on Oct. 24, 2001. The contents of those applications are incorporated herein by reference.

BACKGROUND OF THE INVENTION

1. Field of the Invention

The present invention generally relates to fabrication of integrated circuits in the semiconductor industry.

2. Discussion of the Background

The fabrication of integrated circuits (IC) in the semiconductor industry typically employs plasma to create and assist surface chemistry within a plasma processing chamber necessary to remove material from and deposit material to a substrate. In general, plasma is formed within the processing chamber under vacuum conditions by heating electrons to energies sufficient to sustain ionizing collisions with a supplied process gas. Moreover, the heated electrons can have energy sufficient to sustain dissociative collisions and, therefore, a specific set of gases under predetermined population of charged species and chemically reactive species suitable to the particular process being performed within the chamber (e.g., etching processes where materials are removed from the substrate or deposition processes where materials are added to the substrate).

The semiconductor industry is constantly striving to produce smaller ICs and to increase the yield of viable ICs. Accordingly, the material processing equipment used to process the ICs have been required to meet increasingly more stringent performance requirements for etching and deposition processes (e.g., rate, selectivity, critical dimension, etc.).

SUMMARY OF THE INVENTION

The present invention relates to a method and apparatus for monitoring wall film in a plasma processing chamber. The present invention advantageously provides a method and apparatus that enables semiconductor manufacturers to satisfy more stringent performance requirements for material processing equipment used in the semiconductor industry.

The present invention advantageously provides a plasma processing system that generally includes a plasma chamber and a monitoring system for use in the plasma chamber. The monitoring system of the present invention includes a first microwave mirror and a second microwave mirror each having a concave surface. The first microwave mirror and the second microwave mirror are adapted to be provided within the plasma chamber, such that the concave surface of the second microwave mirror is oriented opposite the concave surface of the first microwave mirror. The invention further includes a power source coupled to the first microwave mirror. The power source is configured to produce a microwave signal. The invention includes a detector coupled to at least one of the first microwave mirror and the second microwave mirror, where the detector is configured to measure a vacuum resonance voltage of the microwave signal within the plasma chamber. The invention also includes a control system connected to the detector and configured to compare a first measured vacuum resonance voltage and a second measured vacuum resonance voltage. The control system is configured to determine whether the second measured vacuum resonance voltage exceeds a threshold value.

The present invention further advantageously provides a method of monitoring wall film in a plasma chamber. The plasma chamber includes a first microwave mirror having a concave surface, a second microwave mirror having a concave surface oriented opposite the concave surface of the first microwave mirror, a power source coupled to the first microwave mirror and configured to produce a microwave signal, and a detector coupled to at least one of the first microwave mirror and the second microwave mirror. The method of the present invention includes the steps of loading a wafer in the plasma chamber, setting a frequency of a microwave signal output from the power source to a resonance frequency, and measuring a first vacuum resonance voltage of the microwave signal within the plasma chamber. The method further includes the steps of processing the wafer, measuring a second vacuum resonance voltage of the microwave signal within the plasma chamber, and determining whether the second measured vacuum resonance voltage exceeds a threshold value using the first measured vacuum resonance voltage as a reference value.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DETAILED DESCRIPTION OF THE PREFERRED EMBODIMENTS

The present invention generally relates to fabrication of integrated circuits in the semiconductor industry. The present invention advantageously provides a method and apparatus that enables semiconductor manufacturers to satisfy more stringent performance requirements for material processing equipment used in the semiconductor industry.

A method of improving the performance of material processing equipment is to monitor and control plasma electron density within the processing chamber during the manufacturing process. Ideally, the plasma electron density is maintained such that the processes being performed are uniformly acting upon the entire surface of the substrate upon which work is being performed.

An exemplary device used to measure plasma electron density is a microwave system of suitably high frequency to exceed the electron plasma frequency. The device includes a pair of mirrors immersed in the plasma. Microwave power is coupled to a first microwave port on the first mirror and a detector is utilized to monitor the transmission of microwave power through the resonant cavity formed by the opposing mirrors. The detector is either coupled to a second port on the first mirror or a second port on the second mirror. For a Gaussian beam, cavity transmission occurs at discrete frequencies. The discrete frequencies correspond to an integer number of half wavelengths between the apex of each mirror, as expressed by the following equation:

$$v_{m,n,q} = v_{0,0,q} = \frac{c}{2nd}\left(q + \frac{1}{2}\right), \quad (1)$$

where $v_{0,0,q}$ is a resonant frequency of mode order q (assuming only longitudinal modes, i.e. m=n=0), c is the speed of light in a vacuum, n is the index of refraction for the medium bounded by the mirrors and d is the mirror spacing (apex-to-apex). For a vacuum, n=1, however, the presence of plasma or, more specifically, a population of free electrons leads to a reduction of the index of refraction or an observable increase (shift) of the cavity resonance frequencies $v_{0,0,q}$. For a given mode q, the shift in frequency can be related to the index of refraction n and, thereafter, the (integrated) electron density $\langle n_e \rangle$, is expressed by the following equation:

$$\langle n_e \rangle \cong \frac{8\pi^2 \varepsilon_o}{e^2} v_o \Delta v, \quad (2)$$

for $v_0 \gg \omega_{pe}/2\pi$. For further details, the use of the above system to measure plasma electron density is described in International App. No. PCT/US00/19539 (based upon U.S. Ser. No. 60/144,880), International App. No. PCT/US00/19536 (based upon U.S. Ser. No. 60/144,883), International App. No. PCT/US00/19535 (based upon U.S. Ser. No. 60/144,878), and International App. No. PCT/US00/19540 (based upon U.S. Ser. No. 60/166,418), each of which is incorporated herein by reference in their entirety.

In addition to monitoring plasma electron density, it is also advantageous to monitor the plasma chemistry within the processing chamber. In particular, it is advantageous to monitor the formation of generally polymeric thin films on the process chamber walls arising from the adsorption of products of complex chemical interactions between the plasma chemistry, substrate surface chemistry including etch products, photoresist (substrate mask material) chemistry, and wall chemistry. When film growth within the chamber becomes excessive, internal stresses within the films can become great leading to flaking. The flaking of films formed within the chamber can cause particulate formation in the process that can be catastrophic to devices on the processed substrate. In order to combat this problem, the material processing equipment undergoes periodic shut-down and cleaning. A precise method and apparatus is needed to monitor film growth before either valuable substrates are damaged or "tool down-time" leads to excessive operating costs.

The present invention provides a diagnostic tool that is used to precisely monitor film growth within the plasma processing chamber, thereby leading to repeatable quality of devices processed in an efficient manner within the chamber.

Figure 1A:
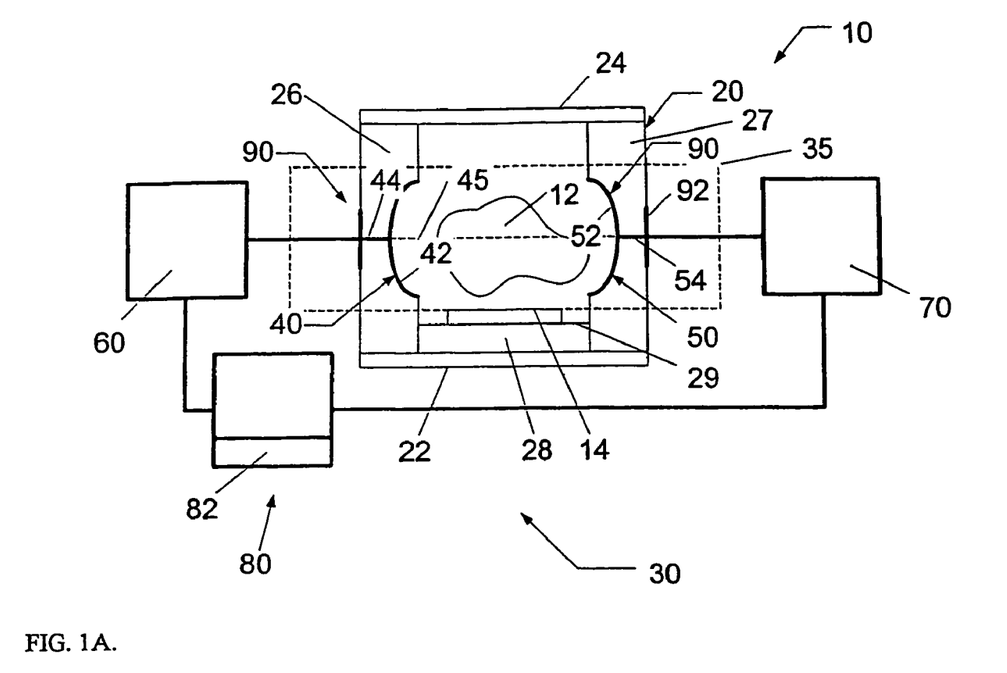
FIG. 1A is a schematic view of a wall film monitoring system for a plasma processing chamber according to an embodiment of the present invention.

An embodiment of the plasma processing system 10 according to the present invention is depicted in FIG. 1A. The plasma processing system 10 includes a plasma chamber 20 and a monitoring system 30 for use in the plasma chamber. The monitoring system generally includes at least one multi-modal resonator 35, power source 60, detector 70, and control system 80. Desirably, multi-modal resonator 35 comprises an open resonant cavity having at least one reflecting surface, and reflecting surfaces can have planar and/or non-planar geometries. In a preferred embodiment, the reflecting surfaces are provided within plasma chamber 20. Alternatively, at least one reflecting surface can be provided outside plasma chamber 20.

The plasma chamber 20 generally includes a base wall 22, an upper wall 24, and side walls including a first side wall 26 and a second side wall 27. The plasma chamber 20 also includes a substrate holder (or chuck assembly) 28 having a wafer plane 29, such as an upper surface of the substrate holder 28 upon which a substrate 14 is positioned in order to be processed within the plasma chamber 20.

In a preferred embodiment, multi-modal resonator 35 comprises first microwave mirror 40 coupled to power source 60, and second microwave mirror 50 coupled to detector 70. Multi-modal resonator extends along an axis generally parallel to a wafer plane of substrate holder 28 within plasma chamber 20.

In a preferred embodiment, the first microwave mirror 40 has a concave surface 42 and is provided within the plasma chamber 20. The second microwave mirror 50 has a concave surface 52 and is also provided within the plasma chamber 20. Alternately, the mirror surfaces can have flat and/or convex surfaces.

In the embodiment depicted in FIG. 1A, the first mirror 40 is integrated within side wall 26 of the plasma chamber 20 and the second mirror 50 is integrated within side wall 27 of the plasma chamber 20. The concave surface 52 of the second microwave mirror 50 is oriented opposite the concave surface 42 of the first microwave mirror 40. This geometry can be referred to as a confocal geometry when the spacing between the mirrors equals the radius of curvature of the mirrors. In an alternate embodiment, the mirrors are arranged in a semi-confocal configuration wherein a first mirror (comprising a concave surface of radius of curvature R) is located a distance d=R from a second mirror comprising a flat surface. In an alternate embodiment, the spacing d is adjusted to be different than the radius of curvature of both mirrors in the confocal arrangement or the radius of curvature of the first mirror in the semiconfocal arrangement. In an alternate embodiment, the radius of curvature for each mirror is arbitrary. The selection of the spacing and respective mirror radii of curvature is well known to those skilled in the art of designing resonant cavities.

The power source 60 is coupled to the first microwave mirror 40 and is configured to produce a microwave signal. Desirably, the microwave signals within multi-modal resonator 35 extend along an axis 45 generally parallel to a wafer plane 29 of a substrate holder 28. Control system 80 is coupled to power source 60 and is adapted to change at least one of: an output frequency, an output power, an output phase, and an operating state of power source 60. For example, control system 80 can cause power source 60 to change its operational state at various times before, during, and after a plasma has been established in plasma chamber 20.

Control system 80 is also coupled to detector 70. Desirably, detector 70 is configured to measure at least one transmitted microwave signal and provide transmitted signal measurement data, and detector 70 is configured to measure at least one reflected microwave signal and provide reflected signal measurement data. Alternately, detector 70 is configured to measure at least one transmitted microwave signal and provide transmitted signal measurement data, or detector 70 is configured to measure at least one reflected microwave signal and provide reflected signal measurement data.

The embodiment of the monitoring system 30 depicted in FIG. 1A also includes the detector 70 coupled to the second microwave mirror 50. The detector 70 is configured to measure a vacuum resonance voltage of the microwave signal within the plasma chamber 20. The control system 80 is connected to the detector 70 and is configured to compare a first measured vacuum resonance voltage and a second measured vacuum resonance voltage. The control system 80 is configured to determine whether the first measured vacuum resonance voltage and/or the second measured vacuum resonance voltage exceeds a threshold value. The control system 80 is also configured to determine whether the difference between the first measured vacuum resonance voltage and the second measured vacuum resonance voltage exceeds a threshold value. Desirably, control system 80 determines signal frequency, signal amplitude, and signal quality (Q).

In the embodiment depicted in FIG. 1A, the microwave mirrors 40 and 50 are immersed within the process plasma 12 such that the concave surfaces 42 and 52, respectively, oppose one another. Microwave power is input from the power source 60 to the first mirror 40 via a microwave aperture and the detector 70 is configured to monitor cavity transmission by being coupled to the opposite second mirror 50. The detector 70 can be coupled to either the mirror opposite to the mirror to which microwave power is input, as is the case in FIG. 1A, or the detector can be coupled to the same mirror to which microwave power is input (i.e. the first mirror 40 in FIG. 1A). As will be discussed in further detail below, microwave windows are inserted between the microwave input and the detector, and the respective mirror(s) to which the microwave input and the detector are connected, in order to preserve the integrity of the vacuum within the plasma processing chamber 20.

Figure 1B:
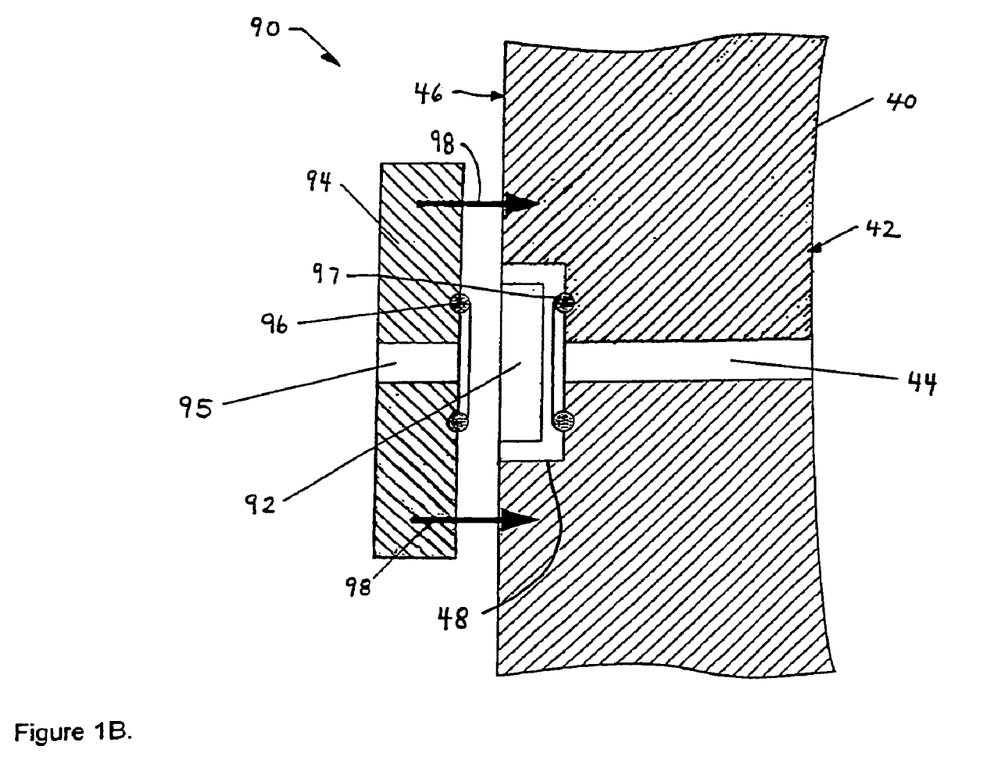
FIG. 1B is an enlarged, exploded, cross-sectional view of a microwave mirror having an aperture, a microwave window and associated mounting structure according to an embodiment of the present invention.

FIG. 1B depicts a detailed schematic of a microwave window assembly 90 for the first mirror 40, which is used to provide a coupling from the power source 60 through an aperture 44 in chamber wall 26 to the first mirror 40. A window assembly 90 having an identical structure is preferably provided for the second mirror 50, which is used to provide a coupling to the detector 70 through an aperture 54 in chamber wall 27 from the second mirror 50.

The microwave window assembly 90 depicted in FIG. 1B includes a microwave window 92 that is fastened between a window flange 94 and a rear surface 46 of the first mirror 40. In the embodiment depicted in FIG. 1B, the window 92 is provided within a recessed portion 48 on the rear surface 46 of the first mirror 40. The microwave window 92 is provided between a first O-ring 96 provided on the window flange 94 and a second O-ring 97 provided on the rear surface 46 of the first mirror 40. A plurality of fasteners 98 are provided to mechanically connect the window flange 94 to the first mirror 40 such that the microwave window 92 is securely mounted to the rear surface 46 of the first mirror 40. The window 92 is centered on a waveguide aperture 95 extending through the window flange 94 and the waveguide aperture 44 extending through the first mirror 40. The rectangular waveguide apertures 44 and 95 are sized for a specific microwave band of operation and are fabricated using EDM. In general, processing material will form on the vacuum or process side of the window 92, however, the processing material will form at a rate different than it will form on the mirror surface exposed to the plasma. The microwave window 92 is fabricated from a dielectric material such as alumina (sapphire), aluminum nitride, quartz, polytetrafluoroethylene (PTFE/Teflon), or Kapton. The window 92 is preferably fabricated from sapphire due to its compatibility with the oxide etch processes.

The mirrors 40 and 50 are preferably fabricated from aluminum. In alternative embodiments, the mirrors 40 and 50 are anodized with preferably a 10 to 50 micron thick anodization or coated with a material such as Yttria ($Y_2O_3$).

The microwave power source 60 is preferably an electronically tunable voltage controlled Gunn diode oscillator (VCO). When the varactor diode of the VCO is biased with a direct current voltage, the output frequency of the VCO can be varied over some spectral range. Therefore, the VCO specifications generally include center frequency, bandwidth and minimum output power. For example, at 35 GHz, a commercially available VCO is a WBV-28-20160RI Gunn diode oscillator offered by Millitech, LLC (20 Industrial Drive East, South Deerfield, Mass. 01373-0109). The specifications for this VCO include a center frequency of 35 GHz with plus or minus 1 GHz bandwidth and a minimum output power of 40 mW. The bias tuning range can generally extend from +25 V to −25 V, thereby adjusting this bias voltage leads to a change in the output frequency of the VCO. In alternative embodiments, operation at higher frequencies, such as 70 GHz and 105 GHZ, can be achieved using a frequency doubler (MUD-15-16F00) or tripler (MUT-10-16F00) with the above mentioned VCO. Using the above configuration, a center frequency of 70 GHz with plus or minus 2 GHz bandwidth and a minimum output power of 0.4 to 0.9 mW and a center frequency of 105 GHz with plus or minus 3 GHz bandwidth and a minimum output power of 0.4 to 0.7 mW can be achieved, respectively. In a preferred embodiment, a 94 GHz VCO (Model GV-10) is used and is commercially available from Farran Technology LTD (Ballincollig, Cork, Ireland). The Model GV-10 VCO has a center frequency of 94 GHz with plus or minus 750 MHz bandwidth, a minimum output power of 10 mW, and a varactor tuning range of −0 to −25 V.

The detector 70 is preferably a general purpose diode detector such as those commercially available from Millitech, LLC. For example, a DXP-15-RNFW0 and a DXP-10-RNFW0 are general purpose detectors in the V-band (50 to 75 GHz) and W-band (75 to 110 GHz), respectively.

Figure 2:
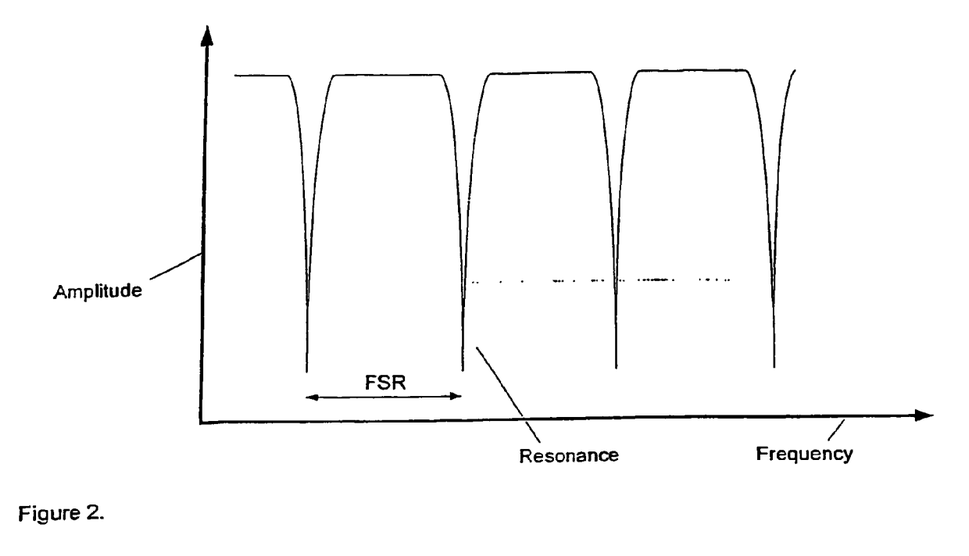
FIG. 2 is a graphical representation of an exemplary cavity transmission function showing several longitudinal resonances and a respective free spectral range.

The embodiment of the present invention depicted in FIG. 1A has a control system 80 that includes a lock-on circuit 82 connected to the power source 60 and the detector 70. Desirably, control system 80 comprises a computer connected to the lock-on circuit 82. The lock-on circuit 82 can be utilized to lock the frequency of the microwave signal output from the microwave power source 60 to a pre-selected cavity resonance. The lock-on circuit 82 superposes a dither signal (e.g. 1 kHz, 10 mV amplitude square wave) on a direct current voltage substantially near the voltage and related output VCO frequency that corresponds with a pre-selected longitudinal frequency in the resonant cavity between the mirrors 40 and 50 of FIG. 1A (i.e. the output frequency of the VCO falls within the "envelope" of the selected cavity resonance). The signal detected by the detector 70 is provided to the lock-on circuit 82, where it represents a first derivative of the cavity transmission function (transmitted power versus frequency). The signal input to the lock-on circuit 82 from the detector 70 provides an error signal by which the direct current component of the VCO bias voltage is adjusted to drive the VCO output frequency to the frequency associated with the peak of a pre-selected longitudinal resonance as shown in FIG. 2. FIG. 2 presents an exemplary cavity transmission function (from a negative polarity detector) indicating several longitudinal resonances and the respective free spectral range (FSR). The cavity transmission as shown in FIG. 2 can be obtained by sweeping the VCO across a suitable frequency range sufficiently greater than the FSR.

As described above, the introduction of plasma within the chamber 20 causes a shift in frequency for each of the resonances shown in FIG. 2 (i.e. each of the resonances shift to the right in FIG. 2 when the electron density is increased or the index of refraction is decreased according to equation (1)). Therefore, once the output frequency of the VCO is locked to a selected cavity resonance, the direct current bias voltage with and without plasma can be recorded and the frequency shift of the selected resonance is determined from the voltage difference and the respective VCO calibration. For example, in wafer processing, the direct current bias voltage is recorded once a new wafer is received by the process tool for materials processing and prior to the ignition of plasma. Hereinafter, this measurement will be referred to as the vacuum resonance voltage. Once the plasma is formed, the direct current bias voltage is obtained as a function of time for the given wafer and the time varying voltage difference or ultimately electron density (via equation (2)) is recorded.

Figure 3:
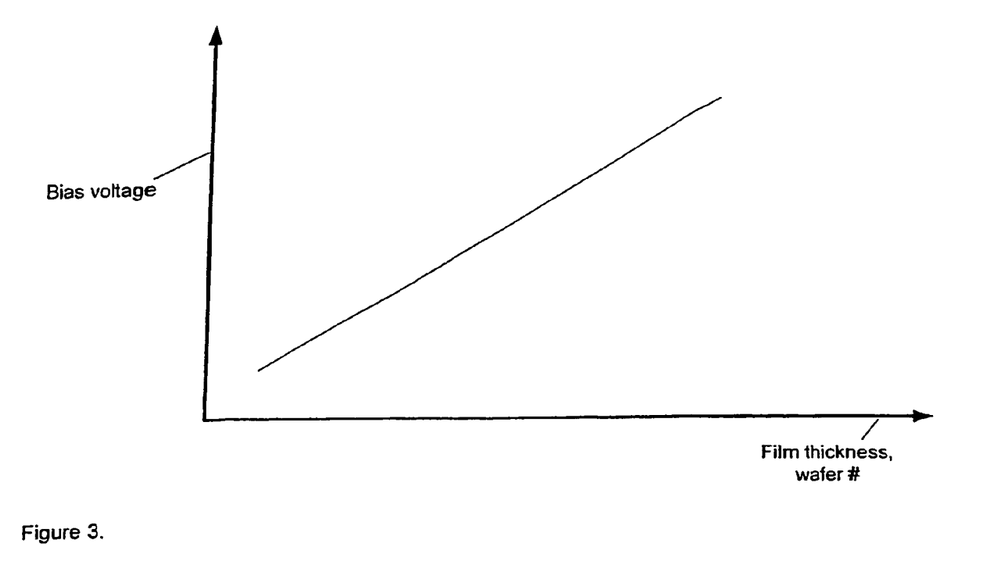
FIG. 3 is a graphical representation of an exemplary variation in direct current bias voltage as a function of mean film thickness or wafer number.

However, as material films form on the surface of the mirrors 40 and 50, the vacuum resonant frequency and corresponding cavity index of refraction will change. In fact, the vacuum cavity index of refraction can generally increase, resulting in a drift of the resonances to lower frequencies. For example, FIG. 3 presents a typical variation of the direct current bias voltage as a function of the mean film thickness (or wafer number). For most material films and a voltage resolution of 1 mV, the wall film growth can be monitored to within 5 microns from wafer-to-wafer and batch-to-batch.

Figure 4:
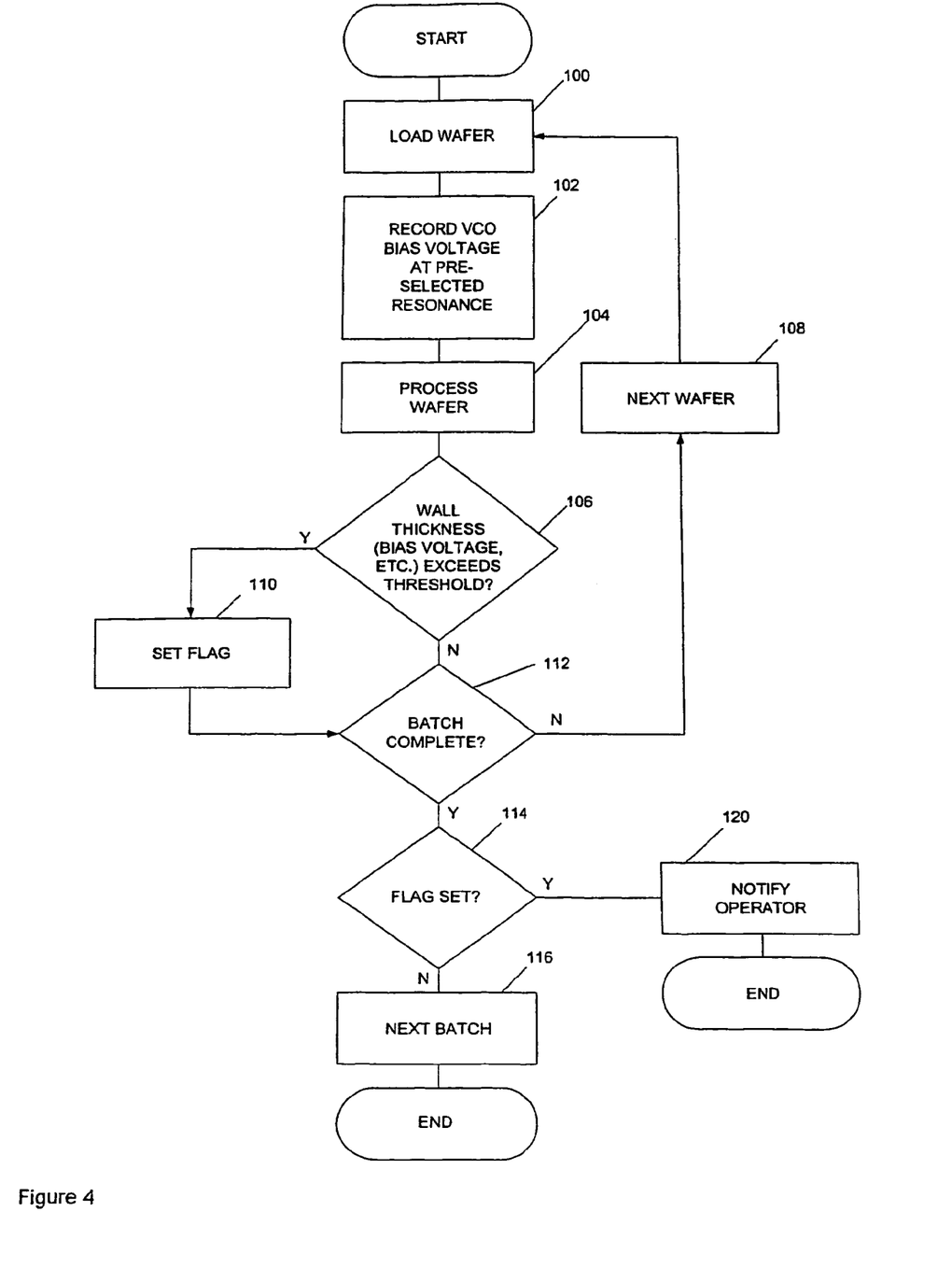
FIG. 4 is a flow diagram of a method of monitoring wall film thickness in a plasma processing chamber according to an embodiment of the present invention.

FIG. 4 is a flowchart of a method of monitoring the bias voltage representative of film thickness from wafer-to-wafer. The process begins with a step 100 of loading a wafer and preparing the chamber for process conditions (i.e. evacuating the chamber, initiating gas flow, etc.). Once the wafer is loaded, a cavity resonance is selected and the lock-on circuit is programmed to lock the VCO output frequency to the selected resonant frequency.

In step 102, transmitted and/or reflected measurement data is obtained. In a preferred embodiment, at least one vacuum resonance voltage is measured and recorded in step 102.

The process proceeds according to a process recipe stored on the process computer in step 104. Once the process is complete or at any time during the process, the measurement data can be processed. For example, a vacuum resonance voltage is compared with voltage measurements performed for earlier wafers, in particular, the "clean" chamber vacuum resonance voltage.

In step 106, control system 80 determines whether or not the measurement data indicates a problem with the film thickness on the chamber wall. For example, control system 80 determines if the vacuum resonance voltage exceeds a set threshold value that corresponds to a film thickness (e.g., 500 micron). If the threshold value has not been reached and the current batch is not complete as determined in step 112, then the next wafer in step 108 is loaded and processed (i.e. steps 100, 102, 104, and 106 are repeated for the next wafer). If the threshold value is reached, then a warning flag is set in step 110. If the batch is not complete, then the next wafer in the batch in step 108 is loaded and processed (i.e. steps 100, 102, 104, and 106 are repeated) until all the wafers in the current batch are completed. In step 114, it is determined whether the warning flag has been previously set. If the warning flag has been set, then the operator is notified in step 120 and the next batch is scheduled for processing following tool cleaning and preventative maintenance. If the flag is not set, then substrate processing continues with the next batch in step 116.

The present invention provides a method of monitoring wall film in a plasma chamber, such as that depicted in FIG. 1A. For example, the plasma chamber 20 includes a multi-modal resonator having a first reflecting surface, a second reflecting surface oriented opposite the first reflecting surface, a power source coupled to the first reflecting surface and configured to produce a microwave signal, and a detector coupled to at least one of the first reflecting surface and the second reflecting surface. The method of the present invention includes the steps of setting a frequency of a microwave signal output from the power source to a resonance frequency, and measuring transmitted and/or reflected microwave energy within the plasma chamber using at least one detector. The method further includes the steps of processing the measurement data, and determining whether the measurement data exceeds a threshold value.

Figure 5:
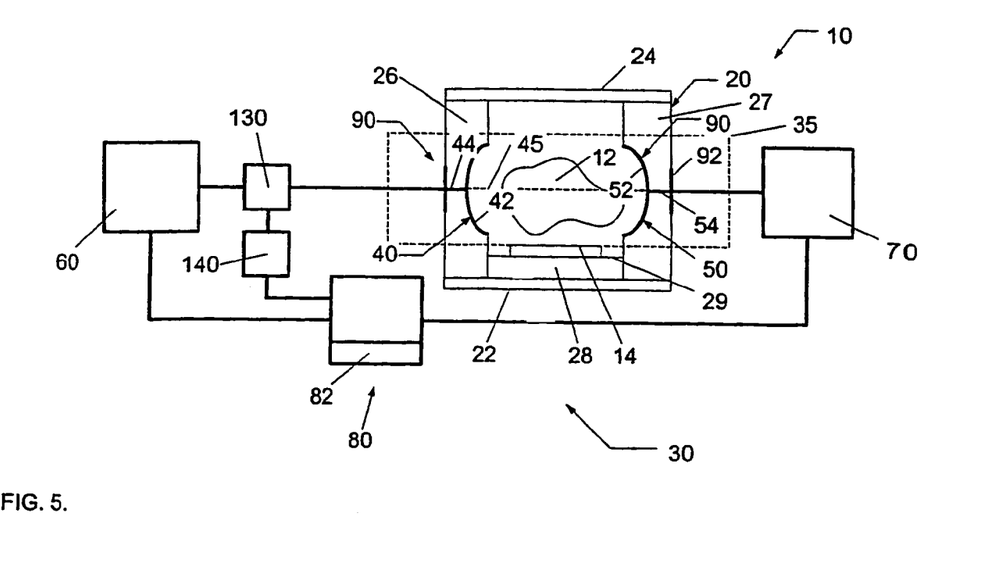
FIG. 5 is a schematic view of a wall film monitoring system for a plasma processing chamber according to an alternative embodiment of the present invention.

An alternative embodiment of the plasma processing system 10 according to the present invention is depicted in FIG. 5. The plasma processing system 10 of the alternative embodiment includes many of the same components of the first embodiment. For example, plasma processing system 10 (FIG. 5) includes plasma chamber 20 and monitoring system 30 for use in the plasma chamber. The monitoring system generally includes at least one multi-modal resonator 35, power source 60, detector 70, and control system 80. Desirably, multi-modal resonator 35 comprises an open resonant cavity having at least one reflecting surface, and reflecting surfaces can have planar and/or non-planar geometries. In the illustrated embodiment, the reflecting surfaces are provided within plasma chamber 20. Alternatively, at least one reflecting surface can be provided outside plasma chamber 20.

The multimodal resonator generally includes a first microwave mirror 40 and a second microwave mirror 50.

The illustrated embodiment further provides for the monitoring of the reflection of power incident on the window 92 through which microwave power is coupled to the resonant cavity. FIG. 5 presents a schematic illustration much like that of FIG. 1A, except that a 3-port directional coupler 130 is inserted between the microwave input (i.e. VCO) 60 and the input mirror 40. The 3-port directional coupler is connected to a second detector 140 that is coupled to control system 80. Exemplary 3-port couplers are commercially available from Millitech such as a CL3-15-R2000N and a CL3-10-R2000N for use in V-band and W-band applications, respectively. The 3-port coupler 130 as shown in FIG. 5 enables one to pick off a signal proportional to the power associated with the microwave signal reflection from the window 92 and the cavity transmission. Alternately, a 4-port coupler can be used to monitor both transmitted and reflected signals.

As an alternative to the processes depicted in FIG. 4, the processing of a batch can be terminated mid-batch if the uniformity is not within prescribed limits. In such an embodiment, the system tracks which wafers still need to be processed when the wafer cartridge is reloaded.

It should be noted that the exemplary embodiments depicted and described herein set forth the preferred embodiments of the present invention, and are not meant to limit the scope of the claims hereto in any way.

Numerous modifications and variations of the present invention are possible in light of the above teachings. It is therefore to be understood that, within the scope of the appended claims, the invention may be practiced otherwise than as specifically described herein.

The invention claimed is:

1. A method of monitoring wall film in a plasma chamber, the plasma chamber including a multi-modal resonator, a power source coupled to the multi-modal resonator and configured to produce a microwave signal, and a detector coupled to the multi-modal resonator configured to provide at least one of transmitted measurement data and reflected measurement data, said method comprising:

loading a wafer in the plasma chamber;

setting a frequency of a microwave signal output from the power source to a resonance frequency at which the microwave signal resonates in the plasma chamber;

measuring a first vacuum resonance voltage of the power source corresponding to the resonance frequency of the microwave signal within the plasma chamber without plasma;

processing the wafer;

measuring a second vacuum resonance voltage of the power source corresponding to a change in the resonance frequency of the microwave signal within the plasma chamber without plasma and after the processing the wafer; and determining whether the second measured vacuum resonance voltage exceeds a threshold value using the first measured vacuum resonance voltage as a reference value.

2. The method according to claim 1, further comprising:

locking a frequency of the microwave signal to a pre-selected resonance frequency;

receiving a detection signal from the detector; and providing a corresponding error signal to the power source to adjust an output frequency of the microwave signal to a frequency associated with a peak of a pre-selected longitudinal resonance.

3. The method according to claim 1, wherein the threshold value corresponds to a predetermined plasma chamber wall film thickness.

4. The method according to claim 1, further comprising:

outputting the microwave signal from the power source via a reflective surface, wherein the power source is coupled to the multi-modal resonator via the reflective surface.

5. The method according to claim 4, wherein the reflective surface is a concave microwave mirror.

6. The method according to claim 1, wherein the measuring the first and second vacuum resonance voltages of the microwave signal with the detector include detecting the microwave signal with a reflective surface which is coupled to the detector.

7. The method according to claim 1, further comprising:

transmitting the microwave signal output from the power source through a first window of the plasma chamber, wherein the measuring the first and second resonance voltages include detecting the microwave signal through a second window.

8. The method according to claim 7, wherein the transmitting includes transmitting through the first window of the plasma chamber via a waveguide in a direction generally parallel to a wafer plane of a substrate holder of the plasma chamber.

9. The method according to claim 7, wherein the detecting the microwave signal through a second window includes detecting via a waveguide.

10. The method according to claim 1, further comprising:

transmitting the microwave signal output from the power source into the multi-modal resonator; and reflecting the transmitted microwave signal within the multi-modal resonator, wherein the measuring the first and second resonance voltages each include measuring, with the detector, the reflected microwave signal and providing reflected signal measurement data, including the first and second vacuum resonance voltages, respectively.

11. The method according to claim 10, wherein the determining includes comparing the provided reflected signal measurement data to the threshold value.

12. The method according to claim 1, further comprising:

determining whether the wall film has accumulated to a predetermined wall thickness on a wall of the plasma chamber based on a difference between the first and second vacuum resonance voltages.

* * * * *